(12) United States Patent
Waterford et al.

(10) Patent No.: US 9,647,471 B2
(45) Date of Patent: May 9, 2017

(54) BATTERY MANAGEMENT SYSTEM AND METHOD

(71) Applicant: Waterford Battery Systems Inc., Deerfield Beach, FL (US)

(72) Inventors: Steve Waterford, Deerfield Beach, FL (US); Thomas R. Zwaska, Deerfield Beach, FL (US)

(73) Assignee: Trion Energy Solutions Corp., Deerfield Beach, FL (US)

( * ) Notice: Subject to any disclaimer, the term of this patent is extended or adjusted under 35 U.S.C. 154(b) by 75 days.

(21) Appl. No.: 14/517,766

(22) Filed: Oct. 17, 2014

(65) Prior Publication Data

US 2016/0111901 A1    Apr. 21, 2016

(51) Int. Cl.
| | |
|---|---|
| *H02J 7/00* | (2006.01) |
| *G01R 31/36* | (2006.01) |
| *H01M 10/42* | (2006.01) |
| *H01M 10/48* | (2006.01) |
| *H01M 10/04* | (2006.01) |

(52) U.S. Cl.
CPC ........ *H02J 7/0042* (2013.01); *G01R 31/3606* (2013.01); *H01M 10/425* (2013.01); *H01M 10/48* (2013.01); *G01R 31/3679* (2013.01); *H01M 10/0436* (2013.01); *H01M 2010/4271* (2013.01)

(58) Field of Classification Search
CPC .................................................. H02J 7/0042
USPC ................................................ 320/107, 112
See application file for complete search history.

(56) References Cited

U.S. PATENT DOCUMENTS

| | | | |
|---|---|---|---|
| 3,915,751 A | 10/1975 | Hamada et al. | |
| 4,307,161 A | 12/1981 | Brown | |
| 5,147,737 A | 9/1992 | Post et al. | |
| 5,425,858 A | 6/1995 | Farmer | |

(Continued)

FOREIGN PATENT DOCUMENTS

| | | |
|---|---|---|
| CA | 2428331 A1 | 11/2004 |
| CN | 201877526 U | 6/2011 |

(Continued)

OTHER PUBLICATIONS

Tinnemeyer, "Diamagnetic Measurements in Lead Acid Batteries to Estimate State of Charge", 44th Power Sources Conference (2010), pp. 508-511.

(Continued)

*Primary Examiner* — Richard V Muralidar
(74) *Attorney, Agent, or Firm* — Corridor Law Group, P.C.

(57) ABSTRACT

A battery management system (BMS) monitors and reports on an operational state of a battery. In some embodiments the BMS can be part of a battery assembly. In at least one embodiment the BMS can monitor battery voltage, charge and discharge current, temperature and (via a measurement utilizing magnetism) chemical change in a battery. In some embodiments, a permanent magnet is placed within the battery and a magnetoresistance sensor on the battery management system circuit board is employed to measure the affected magnetic field from the chemical change within the battery as it moves from a discharged state to a charged state and back to a discharged state. This measurement provides for an accurate statement of the battery's present day state of charge and state of health.

18 Claims, 6 Drawing Sheets

(56) References Cited

U.S. PATENT DOCUMENTS

| | | |
|---|---|---|
| 5,536,595 A | 7/1996 | Inkmann et al. |
| 5,552,242 A | 9/1996 | Ovshinsky et al. |
| 5,590,058 A | 12/1996 | Foreman |
| 5,626,989 A | 5/1997 | Doundoulakis |
| 6,444,352 B1 | 9/2002 | Herrmann et al. |
| 6,469,512 B2 | 10/2002 | Singh et al. |
| 6,668,247 B2 | 12/2003 | Singh et al. |
| 6,689,510 B1 | 2/2004 | Gow et al. |
| 6,778,913 B2 | 8/2004 | Tinnemeyer |
| 7,164,272 B1 | 1/2007 | Bel et al. |
| 7,479,344 B1 | 1/2009 | McDermott |
| 7,547,487 B1 | 6/2009 | Smith et al. |
| 7,554,294 B2 | 6/2009 | Srinivasan et al. |
| 7,615,967 B2 | 11/2009 | Cho et al. |
| 7,682,728 B2 | 3/2010 | Harper |
| 7,768,235 B2 | 8/2010 | Tae et al. |
| 7,800,345 B2 | 9/2010 | Yun et al. |
| 7,851,080 B2 | 12/2010 | Weber et al. |
| 8,017,259 B2 | 9/2011 | Yang et al. |
| 8,357,464 B2 | 1/2013 | Sastry et al. |
| 8,765,282 B2 | 7/2014 | Herrmann |
| 8,822,067 B2 | 9/2014 | Johnson et al. |
| 2002/0055038 A1 | 5/2002 | Aihara et al. |
| 2005/0238953 A1 | 10/2005 | Urso et al. |
| 2008/0086247 A1 | 4/2008 | Gu et al. |
| 2009/0140742 A1 | 6/2009 | Koch et al. |
| 2009/0202903 A1* | 8/2009 | Chiang ............... H01M 4/0426 429/203 |
| 2009/0251149 A1 | 10/2009 | Buckner et al. |
| 2010/0079145 A1 | 4/2010 | Meisner et al. |
| 2011/0074432 A1 | 3/2011 | Tinnemeyer |
| 2011/0123851 A1 | 5/2011 | Byun |
| 2011/0151284 A1 | 6/2011 | Baek et al. |
| 2011/0151303 A1 | 6/2011 | Cherng et al. |
| 2011/0248680 A1 | 10/2011 | Timmons et al. |
| 2012/0003505 A1 | 1/2012 | Kim et al. |
| 2012/0032513 A1 | 2/2012 | Tsu et al. |
| 2012/0056584 A1 | 3/2012 | Mariels |
| 2012/0094165 A1 | 4/2012 | Valencia et al. |
| 2012/0116699 A1* | 5/2012 | Haag ................... B60L 3/0046 702/63 |
| 2012/0133521 A1 | 5/2012 | Rothkopf et al. |
| 2012/0177972 A1 | 7/2012 | Lai et al. |
| 2012/0183835 A1 | 7/2012 | Young et al. |
| 2012/0316814 A1 | 12/2012 | Rahaman et al. |
| 2013/0088204 A1 | 4/2013 | Khare et al. |
| 2013/0101881 A1 | 4/2013 | Syed et al. |
| 2013/0260194 A1 | 10/2013 | Meyer et al. |
| 2013/0288096 A1* | 10/2013 | Frutschy ............. H01M 2/1088 429/99 |
| 2014/0087237 A1 | 3/2014 | Dhar et al. |
| 2014/0113177 A1 | 4/2014 | Dhar et al. |
| 2014/0141287 A1 | 5/2014 | Bertucci et al. |
| 2014/0184165 A1* | 7/2014 | Takahashi ............. H01M 10/48 320/134 |
| 2015/0357124 A1* | 12/2015 | Waterford ............. H01G 11/78 429/82 |

FOREIGN PATENT DOCUMENTS

| | | |
|---|---|---|
| CN | 102479971 A | 5/2012 |
| EP | 0546872 A1 | 6/1993 |
| EP | 0629017 A1 | 12/1994 |
| EP | 1304755 A2 | 12/2007 |
| EP | 0969542 A1 | 6/2010 |
| EP | 1397841 | 11/2010 |
| EP | 2541668 A1 | 1/2013 |
| EP | 2262040 B1 | 8/2014 |
| GB | 1241972 A | 8/1971 |
| JP | Heisei 2005304173 A | 10/2005 |
| KR | 1020070112489 A | 11/2007 |
| RU | 2340983 C1 | 12/2008 |
| WO | 9510127 A1 | 4/1995 |
| WO | 0229917 A1 | 4/2002 |
| WO | 2004103469 A1 | 3/2005 |
| WO | 2005033798 A2 | 7/2006 |
| WO | 2009146547 A1 | 12/2009 |
| WO | 2012024330 A2 | 5/2012 |
| WO | 2012149477 A2 | 12/2012 |
| WO | 2012092467 A2 | 1/2013 |

OTHER PUBLICATIONS

Nordic Patent Institute Novelty Search Report dated Feb. 28, 2014.
Invitation to Pay Additional Fees mailed Jan. 8, 2015 in connection with PCT/US2014/061276.
International Search Report and Written Opinion dated Mar. 12, 2015 in connection with PCT/US2014/061276.
International Search Report and Written Opinion dated Sep. 1, 2015 in connection with PCT/US2015/034587.

* cited by examiner

BATTERY MANAGEMENT SYSTEM AND METHOD

FIELD OF THE INVENTION

The present invention relates to batteries and more particularly to a battery management system. The battery management system monitors and tracks the charge, discharge and relaxation states of an associated battery and provides an ability to more accurately determine a state of charge and state of health of the associated battery.

BACKGROUND OF THE INVENTION

The use of batteries and energy storage devices has become prevalent in today's high-tech world. According to LUX Research the market for energy storage in mobile applications will go from $28 billion in 2013 to $41 billion in 2018, excluding starter batteries, fixed installation batteries and super capacitors. Batteries are used to power everyday devices including laptops, tablets, smartphones, military devices, and increasingly, hybrid and electric cars. Unfortunately, while these devices have become more powerful and as a result require an increasing amount of energy to run, there have been fewer corresponding advancements in battery chemistries and associated monitoring technology.

Current battery management systems generally monitor electrical characteristics such as battery voltage, charge and discharge current and temperature to determine state of charge (SOC). Various methods for monitoring electrical characteristics are well known, such as those disclosed in U.S. patent application Ser. No. 11/768,506; U.S. patent application Ser. No. 13/297,025; and U.S. patent application Ser. No. 10/398,860. However, what is needed is a measurement system that increases the accuracy of the reported battery SOC and provides an accurate evaluation of a battery state of health (SOH).

SUMMARY OF THE INVENTION

A battery management system comprises:
(a) a bottom enclosure section;
(b) a top enclosure section;
(c) a source for generating a magnetic field;
(d) a printed circuit board comprising:
  (i) a current sense resistor;
  (ii) a processor; and
  (iii) a sensor.

The battery management system can further comprises:
(e) a conductive infusion.

In an embodiment of the battery management system, the top enclosure section and the bottom enclosure section are configured to create a snap-fit assembly. The snap-fit assembly can be accomplished via at least one male barbed pin and at least one barbed pin hole configured to accept the male barbed pin.

In an embodiment of the battery management system, the bottom enclosure section includes a rib, such that the rib adds structural support. The bottom enclosure section can comprise at least one alignment pin configured to hold the printed circuit board in place. The bottom enclosure section can comprise a first injection hole and a second injection hole wherein the first and second injection holes are configured to allow for an injected conductive infusion to flow through electrically connecting a battery management system wafer to a battery wafer.

In an embodiment, the circuit board further comprises:
(a) a positive charging pole;
(b) a positive load pole;
(c) a negative charging and load pole; and
(d) a conductive contact.

In an embodiment of the battery management system, the top enclosure section comprises:
(a) a void configured to receive the circuit board;
(b) at least one penetration configured for the insertion of a conductive contact, wherein the conductive contact provides an external connection to the battery management system;
(c) a first infusion zone;
(d) a second infusion zone; and
(e) a third infusion zone.

In embodiments of the battery management system, the sensor is a magnetoresistance sensor. The sensor is preferably configured to measure a battery's state of charge. The sensor can also be configured to provide measurements used to determine a battery's state of health.

An embodiment of the battery management system further comprises at least one joining pin configured to hold the battery management system against a battery. The battery can be a battery wafer. The battery can also comprise a plurality of battery wafers.

In an embodiment of the battery management system, the magnetoresistance sensor is configured to work with a battery and the source. The source can be a permanent magnet. The permanent magnet is preferably placed on a bottom interior surface of a battery wafer. The permanent magnet is preferably a Neodymium-Iron-Boron magnetic strip.

In a method of assembling a battery management system, in which the system comprises a bottom enclosure section, a top enclosure section, a printed circuit board, a first infusion zone, a second infusion zone, a third infusion zone, and a conductive infusion material comprising carbon nanotubes, the method comprises:
(a) forming a void in the top enclosure section, the void configured to receive the circuit board;
(b) forming a first penetration in the top enclosure section, the first penetration configured to receive a conductive contact positioned on the printed circuit board, the contact capable of providing a communications port for external reporting, control, and monitoring of battery performance and operation;
(c) forming a second penetration in the top enclosure section, the second penetration configured to receive an electrical contact, the electrical contact position to connect to a power pole on the printed circuit board, the electrical contact capable of providing an external power port connection to a battery for charging and through a current sense resistor on the circuit board to the battery for the application load;
(d) injecting the conductive infusion material into the first, second and third infusion zones; and
(e) aligning carbon nanotubes in the conductive infusion material.

In a method of assembling a battery system, in which the system comprises a battery management wafer, a battery wafer, a joining pin, a first infusion hole, a second infusion hole, and a conductive infusion material comprising carbon nanotubes, the method comprises:
(a) stacking the battery management wafer against the battery wafer;

(b) forming the first injection hole and the second injection hole through the battery management wafer and into and through to a bottom of the battery wafer;

(c) injecting the conductive infusion material into the first and second injection holes; and (d) aligning the carbon nanotubes in the conductive infusion material.

DETAILED DESCRIPTION

Synopsis of the Detailed Description

A battery management system (BMS) monitors and reports on the operational state of a battery. A BMS that is made a part of the battery assembly itself can incorporate a number of unique features that overcome shortcomings and disadvantages of prior designs.

In one embodiment, a snap-fit enclosure for a BMS facilitates its attachment to the battery module, the use of conductive infusions replace wire for internal electrical connections and three power poles or terminals allows for high current rapid charging of the battery.

A BMS can be manufactured with a snap-fit, two part enclosure which houses and seals a printed circuit board (PCB) assembly and provides for the PCB assembly to be mechanically and electrically attached to become a part of the battery assembly itself. An assembled BMS in its enclosure can be known as a battery management module or wafer and can be mechanically and electrically attached to one or many battery modules or wafers of similar or like mechanical design. Alternatively, other enclosing and attachment methods can be used as well.

In at least some embodiments, conductive infusions can be used as and to make electrical connections. A conductive infusion is an electrically conductive liquid that is injected into and allowed to flow filling channels and/or voids and then solidified. The conductive infusions can contain, but are not limited to, materials such as graphite, nickel, silver, and carbon nanotubes.

The use of conductive infusions allows the BMS, the battery, and the integration of the BMS with the battery to be completely or at least essentially wire-free. This is significant, as wires and the way they are connected can contribute to the less than ideal performance of current batteries. For example, resistance of wire and soldered, crimped or spot-welded connections can limit the charging currents and, hence, increase charging time for batteries. Conductive infusions can mitigate this limitation and also lower internal battery resistance and, thus, increase long-term performance. Conductive infusions also allow use of materials and methods that are otherwise incompatible with wire and soldered, crimped or spot-welded electrical connections.

In construction of a battery management wafer, infusion zones within the printed circuit board include conductive tabs with plated-through holes to conductive layers and circuit traces of the printed circuit board. The infusion zones also provide for the placement of an electrical contact for external connection to the power poles of the battery management system/battery assembly. In some embodiments, these electrical contacts are gold-coated copper. The conductive infusion that fills an infusion zone electrically connects elements placed within the zone.

The conductive infusion, which can be based on an epoxy or other material, can contain carbon nanotubes to increase electrical and thermal conductivity. The construct of the infusion zone and the nature of the conductive infusion means that the electrical connection is made across a wider physical area and not at a single point of contact as in a wire connection. Thus, the conductive infusion material itself and the resulting infusion zone connection can have an increased electrical and thermal conductivity that can far exceed that of existing copper wires or straps and their single point-of-attachment or connection. Using conductive infusions can also alleviate manufacturing problems associated with cold solder joints or incomplete spot-welded connections. The design of the battery management wafer, the battery wafer and their attachment can also facilitate the alignment of the carbon nanotubes while the infusion is in liquid form and then solidified. Adding carbon nanotubes to the base infusion material alone, even with their random orientation, makes it electrically conductive. If the nanotubes are aligned, meaning all or at least most of the nanotubes are oriented in the same direction, the conductivity is further increased. Carbon nanotubes that are coated with a metal are responsive to a magnetic field. Applying and holding a magnetic field while the liquid infusion transitions to a solid permanently aligns the carbon nanotubes. Conductive infusions with aligned carbon nanotubes have been shown to carry an electric current density of up to $4 \times 10^9$ A/cm$^2$, which is more than 1,000 times greater than those of metals such as copper. Alternatively, the BMS can be incorporated inside a battery that is built using conventional wire, wire like materials or other conductive materials, and applicable connection techniques.

In at least one embodiment, a battery management system contains a three power pole construct with positive charge, positive load and negative load/charge attributes. In this context, positive and negative refer to the polarity of DC (Direct Current) voltage. These power pole connections enable an application load to connect to the BMS/battery using the positive load and negative load/charge poles. Current flow from the battery into the application load passes through a current sense resistor in the BMS. Utilizing positive charge and negative load/charge poles enables rapid charging of the battery at current levels that otherwise would damage the current sense resistor. Alternatively, the BMS can be built with either positive pole eliminated. If there is no need for the current sense resistor, then the positive load pole referenced above can be eliminated and the positive charging pole becomes and functions as the positive load/charging pole. In a like manner, if the battery charging current is limited to a value that does not damage the current sense resistor, then the positive charging pole referenced above can be eliminated and the positive load pole becomes and functions as the positive load/charging pole. Eliminating a pole removes the penetration in the BMS enclosure and electrical contact associated with the pole construct. Other features of the pole construct can remain.

The BMS can incorporate established techniques to determine the SOC and/or the SOH of a battery. These techniques include open circuit voltage (OCV) measurements, voltage measurement during charge, discharge and relaxation conditions, charge and discharge current monitoring known as coulomb counting, monitoring operating temperature, and implementing predictive algorithms related to the known characteristics of a battery type. These techniques provide no means of direct measurement as to the SOC or SOH of a battery. The reported SOC, and if available SOH, are predictive in nature and more accurately provided the battery functions and ages in a normal manner for its type.

In one embodiment of a BMS, a new measurement technique is used that increases the accuracy of the battery SOC and provides an accurate battery SOH parameter. The new technique is based on the principles of magnetic susceptibility. A permanent magnet is placed within the battery, and a magnetoresistance sensor on the battery management system circuit board is employed to detect chemical change within the battery as it moves between a discharged state to a charged state and back to a discharged state. This measurement, because of its direct correlation to an ionic state or chemical composition of each electrode of the battery, provides for an accurate statement of the battery's present day SOC and SOH.

Earlier research, such as that discussed in U.S. patent application Ser. No. 12/994,847 and U.S. patent application Ser. No. 13/646,986, has dealt with using magnetic susceptibility to detect a chemical charge/discharge change in a battery and thus battery SOC and SOH However in these instances, the sensing device is attached to an exterior surface of the battery enclosure. Typically, the sensing device contains both a magnetic field source element and a magnetic field strength sensing element. The construction of the sensing device and its placement on a surface of the enclosure produces a sidewall penetrating field and field strength measurement system. It is unclear how deep into the battery the magnetic field penetrates and whether the full surface area of one or more plates influences the magnetic field. Furthermore, since the charge on battery plates occur in groups or clusters that expand or radiate outward from the point of electrical contact to the plate, a measured magnetic field is influenced by placement of the sensing device near to or opposite the point of electrical contact to battery plates.

Locating the magnetic field source and detection sensor inside the battery, separated by one or more battery plates, advances the technique of utilizing magnetic susceptibility to determine battery SOC and SOH. Placement of the magnetic source such that the magnetic field must pass through or around one or more battery plates to be seen by the magnetic field strength sensor lead to a reading that is influenced by the real level of charge on the battery plate(s). In addition, the use of conductive infusions to make electrical contact along the full or partial edge of a battery plate enhances the charge distribution on the plate and the resulting effect on the magnetic field. These advancements lead to an increased accuracy and reliability in the reported SOC and SOH.

The SOH of a battery is a numerical percentage (%) value that relates to the present day capability of a battery to accept a full charge relative to the capability of a new fully charged battery. This is useful, as the fully charged capability of a battery decreases with age and use. Being able to readily determine and report the SOH of a battery allows potential users that depend on battery operated machinery, such as first responders, to know whether or not the battery they are using is at the end of its useful life and should and/or needs to be replaced.

The SOC of a battery is a numerical percentage (%) value of the current charge of a battery relative to its present day full charge capability, that is, the present day SOH.

One way of detecting SOH and SOC is to utilize and measure the magnetic field created by a given battery at various states of charge. Batteries are chemical systems whose properties change between discharged and charged states. Without being limited to the precise electrochemical mechanism involved, it is believed that the cathode of a battery plate in a discharged state has a specific atomic structure. When a battery is charged, electrons are added to that atomic structure and are stored as energy in the form of an electrical charge. With the additional electrons, the atomic structure changes slightly to become a variation of the original (discharged) chemical. In a like manner, as a charged battery is discharged, electrons are removed from the cathode material and the atomic structure reverts back to that of its discharged state. The properties of a magnetic field in proximity to the battery plate changes as electrons are added to or removed from the atomic structure of the cathode material. It is possible to measure the change in this magnetic field to detect both the SOH and SOC of a battery.

In another embodiment, one or more permanent magnets and one or more magnetoresistance sensors are placed inside the battery assembly. A permanent magnet can be located in proximity to one side of a battery plate and can be used to generate a magnetic field. A magnetoresistance sensor is placed opposite the permanent magnet in such a manner that a change in the strength or other property of the magnet field is detected as a function of the charge/discharge state of the battery.

In at least some embodiments, a magnetic shielding material, for example MuMetal™, can be placed within the battery assembly to redirect or focus the magnetic field such that the charged/discharged state of the battery is detected at the magnetoresistance sensor.

One of the functions of a BMS is to interface with the magnetoresistance sensor and process numerical values representative of measured magnetic properties such as field strength. Four values that can be used to determine SOH and SOC are: Base Battery Discharge (BBD); New Battery Capable Charge (NBCC); Present Day Battery Capable Charge (PDBCC); and Current Battery Charge (CBC). The New Battery Capable Charge (NBCC) value can also be referred to as Maximum State of Health (MaxSOH) and the Present Day Battery Capable Charge (PDBCC) value can also be referred to as Maximum State of Charge (MaxSOC).

The first two values (Base Battery Discharge and New Battery Capable Charge) are determined and set into the BMS when the battery is charged for the first time. The BMS measures the magnetic field of a fully discharged battery; that is a battery that has not been charged. This value becomes the Base Battery Discharge value. The battery is then fully charged. At various points during this process, the BMS measures the magnetic field. These values are used to characterize an algorithm representative of a curve that describes the observed magnetic field relationship between fully discharged and fully charged states. When the battery has been fully charged, the BMS measures the magnetic field and this value becomes the New Battery Capable Charge value. The BMS then reports on the battery's SOC between these two boundaries.

Initially the Present Day Battery Capable Charge value is set equal to the New Battery Capable Charge value. It represents the present day capacity of the battery to store electrical charge. Over the service life of the battery, the battery is repeatedly discharged and again recharged. During the charging process, the BMS measures the magnetic field. Ideally, as the battery is charged this measured value should approach the New Battery Capable Charge value. However, this does not happen as the capacity of the battery to store a charge decreases with age and use. The measured magnetic field plateaus at some point below the New Battery Capable Charge value, and this value is then set into the Present Day Battery Capable Charge value. The difference between the between the New Battery Capable Charge and the Present Day Battery Capable Charge is representative of the health of the battery.

The Current Battery Charge value is the latest measurement by the BMS of the magnetic field and reflects the current charged state of the battery. This value changes as the battery is discharged and again charged. During discharge, the value approaches the Base Battery Discharge value. During charge, the value approaches the Present Day Battery Capable Charge value. The difference between the Present Day Battery Capable Charge value and the Current Battery Charge value is representative of the charged state of the battery.

The basic equations for expressing the State of Health (%) and State of Charge (%) of a battery are as follows. The values used in the calculations relate to the measured properties of the magnetic field as influenced by the degree of charge in the battery plate or plates.

$$SOH\ (\%) = \frac{PDBCC - BBD}{NBCC - BBD} * 100$$

$$SOC\ (\%) = \frac{CBC - BBD}{PDBCC - BBD} * 100$$

DETAILED DESCRIPTION OF CERTAIN EMBODIMENT(S)

Figure 1:
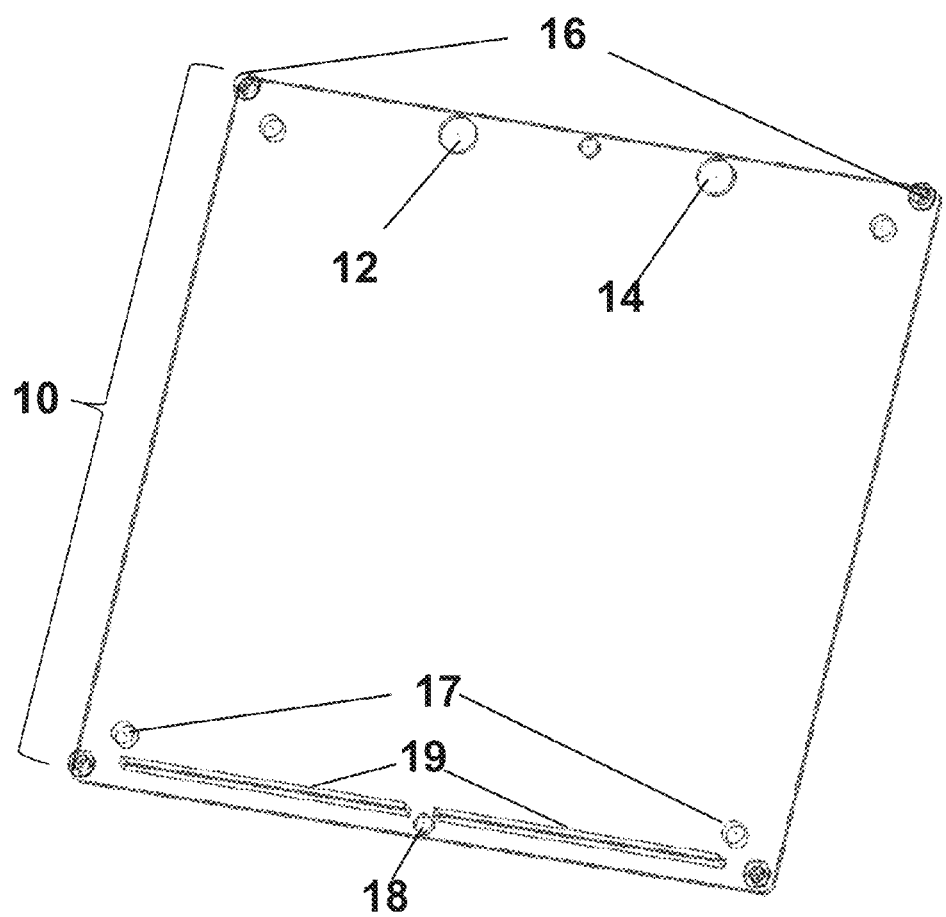
FIG. 1 is a perspective interior view of the bottom section of a battery management system (BMS) wafer enclosure.

FIG. 1 illustrates a perspective interior view of bottom section 10 of a battery management system "BMS" enclosure. Two injection holes, 12 and 14, allow for injection of conductive infusions to connect the BMS with a battery (not shown). Injection hole 12 is for the positive pole, while injection hole 14 is for the negative pole.

Figure 3:
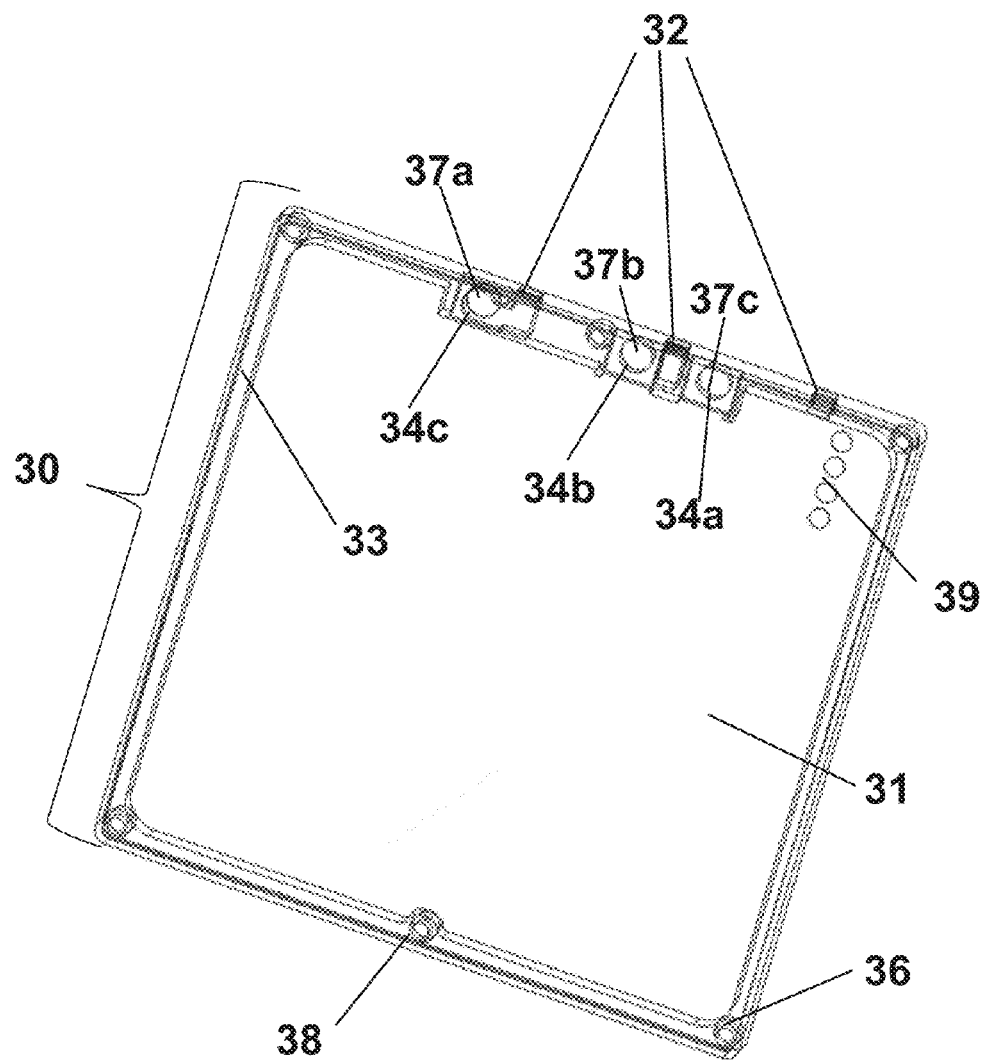
FIG. 3 is a perspective interior view of the top section of a BMS wafer enclosure.

Four corner male barbed pins 16 are configured to fit into four corner receptacle holes 36 (see FIG. 3) of top section 30 (see FIG. 3). This setup creates a snap-fit assembly between bottom section 10 and top section 30.

Four alignment pins 17 are used to position and hold printed circuit board 20 (see FIG. 2) in place. Two joining pin receptacle holes 18 are configured to receive joining pins 48 which hold battery management system wafer 40 against one or many battery wafers 42 (see FIG. 5).

Stiffening ribs 19 add structural support to bottom section 10.

Figure 2:
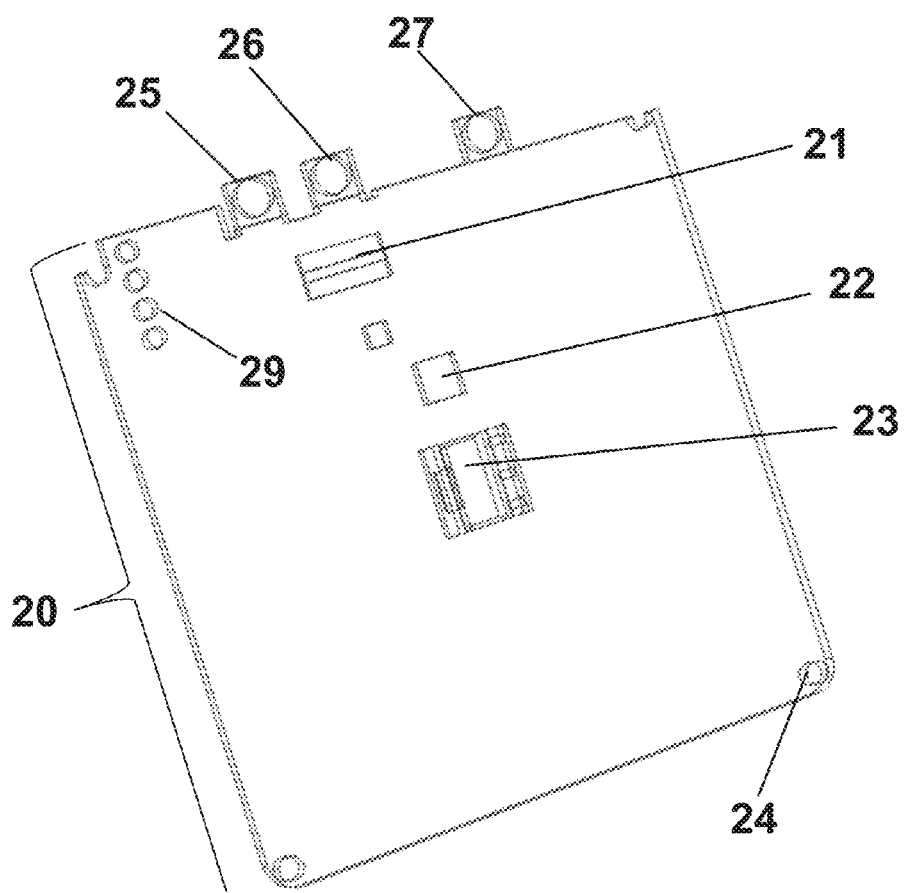
FIG. 2 is a perspective top side view of the printed circuit board of a BMS.

Turning to FIG. 2, printed circuit board 20 includes four corner holes 24 which hold circuit board 20 in place on top of bottom section 10 (not shown) when mounted over alignment pins 17 (see FIG. 1).

Circuit board 20 contains the electronic circuitry of the BMS including current sense resistor 21, processor 22, and magnetoresistance sensor 23. Sensor 23 enables monitoring of a battery's SOC and SOH.

Circuit board 20 also has three unique power pole connections: positive charging pole 25; positive load pole 26; and negative charging and load pole 27. These power pole connections enable an application load to connect to the BMS/battery using positive load pole 26 and negative charging and load pole 27. Current flow into the application load passes through current sense resistor 21. Utilizing charging pole 25 and negative charging and load pole 27 enables rapid charging of the battery at current levels that otherwise would damage current sense resistor 21. These pole connections 25, 26, and 27 include in part of plated-through holes to conductive layers and circuit traces of printed circuit board 20 which can enable the conductive infusion to make equal and constant contact to the circuit board. Circuit board 20 can also include conductive contacts 29 which are elevated through top section 30 (not shown) of the BMS. Conductive contacts 29 provide for external reporting, control and monitoring of battery charging, discharge, SOC and SOH.

FIG. 3 shows an interior side of top section 30 of a battery management system enclosure. Void 31 is configured to receive circuit board 20 (see FIG. 2). Conductive contact through-holes 39 allow for conductive contacts 29 of circuit board 20 (see FIG. 2) to reach the exterior of top structure 30.

Three penetrations 32 are configured for insertion of electrical contacts (not shown) which provide external connection to positive charging pole 25, positive load pole 26 and negative charging and load pole 27.

Four corner male barbed pins 16 of bottom section 10 (see FIG. 1) are configured to fit into four corner receptacle holes 36 thereby enabling a snap-fit assembly between bottom section 10 and top section 30. Bottom section 10 is sized smaller than top section 30 such that it fits within the overall envelope of top section 30 resting on recessed platform 33 when it is snap-fitted into place. Furthermore, two joining pin receptacle holes 38 are configured to receive joining pins 48 which hold battery management system wafer 40 against battery 42 (see FIG. 5).

Also shown in FIG. 3 are three infusion zones 34a, 34b, and 34c. Infusion zone 34a connects positive charging pole 25 to circuit board 20, one of contacts 32 and battery wafer 42. Likewise, infusion zone 34c connects negative pole 27, circuit board 20, one of contacts 32 and battery wafer 42. Similarly, infusion zone 34b connects positive load pole 26 to circuit board 20 and one of contacts 32. Three infusion holes 37a, 37b, and 37c are configured to receive injection of conductive infusions to fill infusion zone 34a, 34b, and 34c. When the infusion contains carbon nanotubes and/or other magnetically alignable particles, while it is still in liquid form, the battery management wafer assembly can be placed atop a magnetic field to enable alignment of carbon nanotubes within the infusion and then the infusion is solidified.

Figure 4:
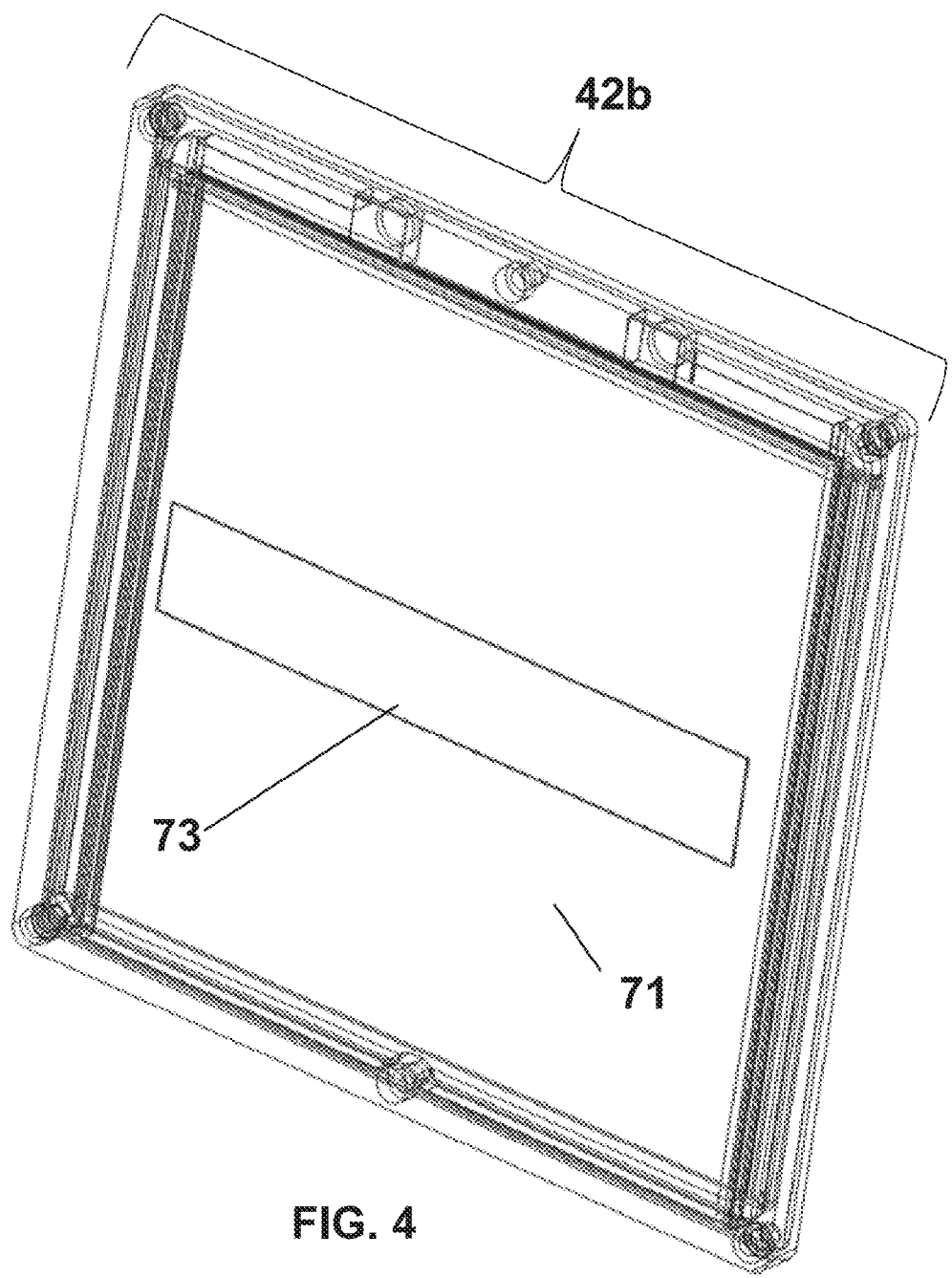
FIG. 4 is perspective view of a battery wafer with a magnetic strip attached for use with the magnetoresistance sensor of the BMS.

FIG. 4 shows battery wafer 42b from a bottom perspective revealing permanent magnet 73 (such as a Neodymium-Iron-Boron magnetic strip) placed in the bottom of the battery wafer enclosure beneath the bottom-most part of the battery plate(s) 71. A permanent magnet is an object made from a material that has been magnetized and thereafter in and of itself creates its own persistent magnet field. Magnet 73 need not be positioned at the center of battery plate 71 nor completely extend across the plate. Magnetic shielding materials can be utilized to focus, direct and/or shape the pattern of the magnetic field.

Figure 5:
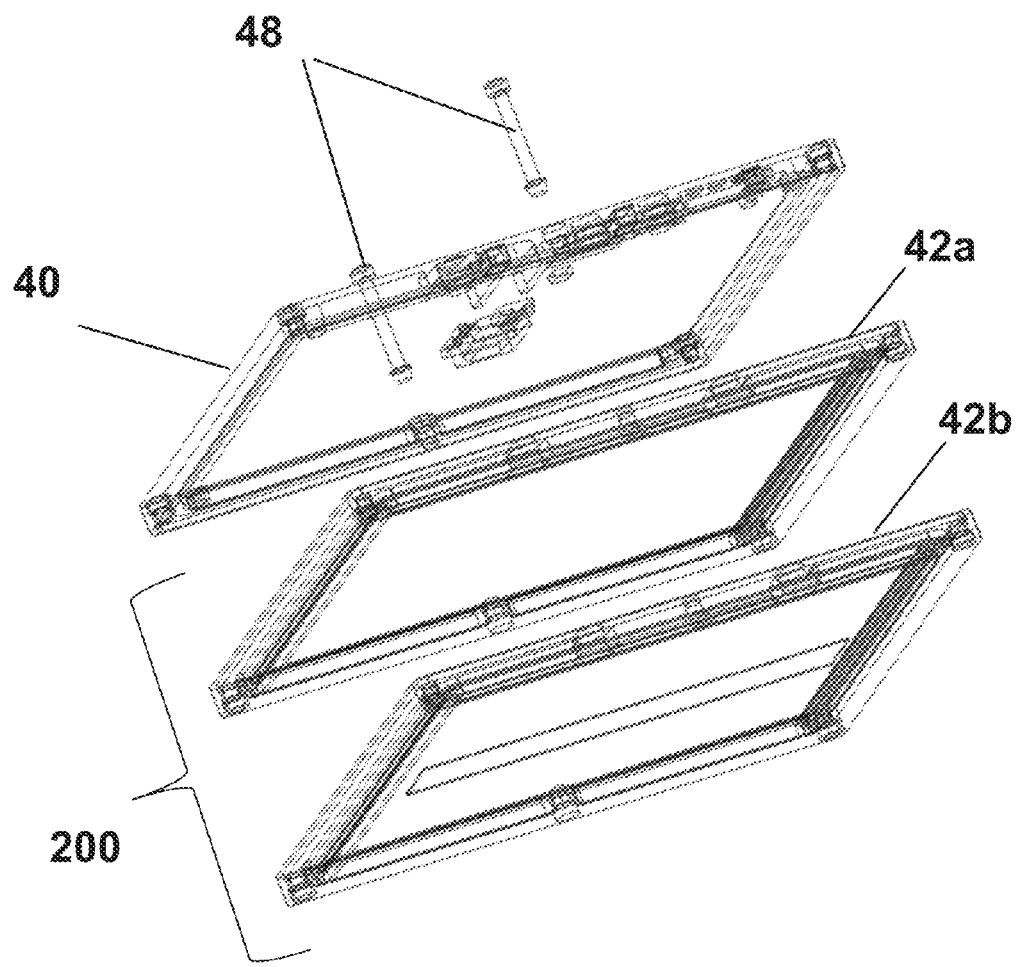
FIG. 5 is an exploded view of a BMS wafer being joined to a stacked assembly of battery wafers.

FIG. 5 shows battery management system wafer 40 stacked in alignment to be mounted against battery 200. In this case, battery 200 is made up of several type 42a battery wafers that do not contain magnet 73 and one type 42b battery wafer that does contain magnet 73. While only two battery wafers 42 are shown, this is only for illustrative purposes. A plurality of battery wafers 42 can be stacked; hence an assembly can be made up of one to thousands of battery wafers 42. The assembly is held together by joining pins 48.

Figure 6:
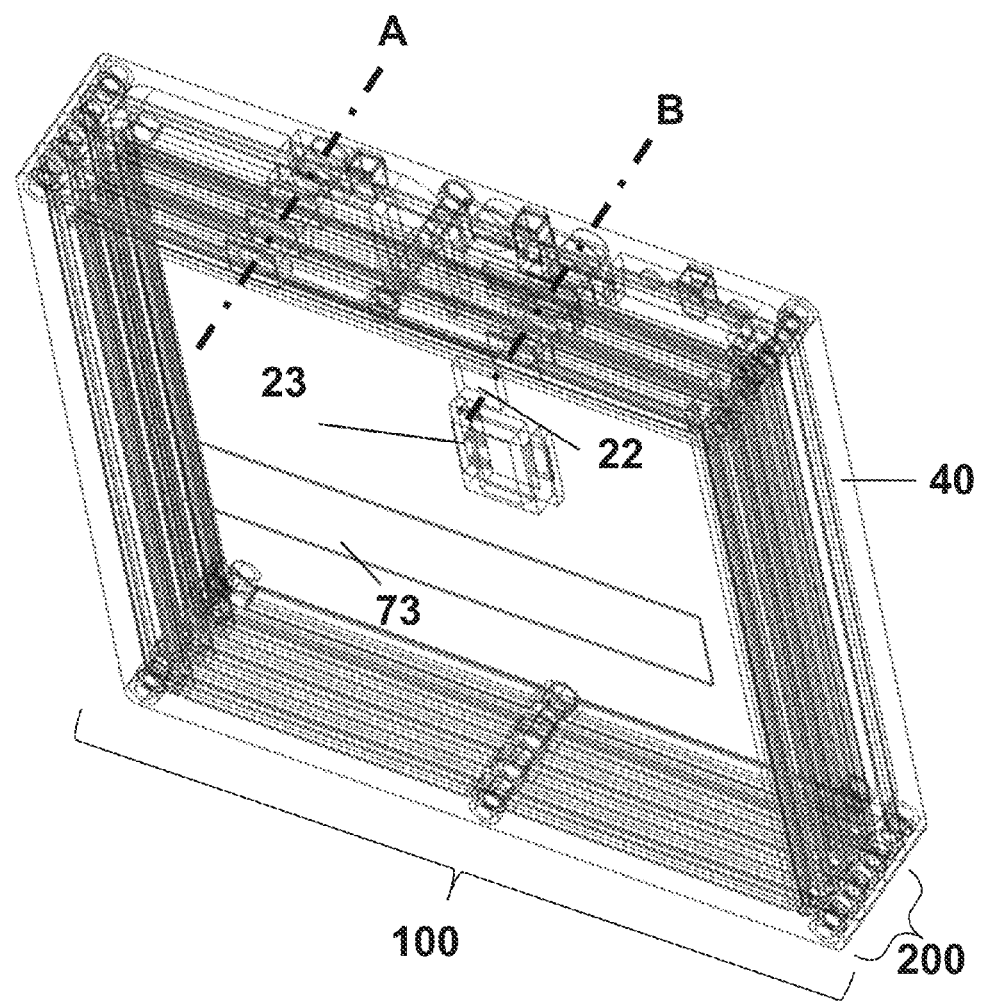
FIG. 6 is a perspective view of a BMS wafer being electrically connected to a stacked assembly of battery wafers.

FIG. 6 is a front perspective view of stacked assembly 100. Conductive infusion fills are manufactured in the assembly of the battery wafer 42 and the battery management wafer 40, in each case the infusion fills the negative and positive charge holes of the respective wafer type. Once the assembly is put together, the wafers are electrically joined together by yet another conductive infusion fill. The negative and positive charge holes are drilled along line A and line B down to the bottom-most layer. This drilling can be conducted with a square end mill, although other bits and/or methods work as well.

Once the holes are drilled, a conductive infusion fills the negative and positive charge holes, and the top is temporarily capped. Then, while the infusion is still in a liquid form, stacked assembly 100 can be placed atop a magnetic field to enable the alignment of carbon nanotubes within the conductive infusion, and then the infusion is solidified.

FIG. 6 illustrates how stacked assembly 100 works with magnetoresistance sensor 23. When BMS wafer 40 is mounted atop battery 200 and integrated via the infusions, sensor 23 detects a level of magnetism that is reaching sensor 23 from permanent magnet 73. The level of magnetism is directly related to the SOC of the battery. Before the battery stack assembly 100 is charged for the first time, the magnetic field level is first read to establish a reading that reflects a fully discharged battery which is then stored in processor 22. The battery is then fully charged which affects the characteristics of the magnetic field level seen at magnetoresistance sensor 23. The magnetic field level is again read to establish a reading that reflects a new, fully charged battery and the Maximum State of Charge (MaxSOC) and the Maximum State of Health (MaxSOH) readings which are stored in processor 22.

As battery stack assembly 100 discharges, magnetoresistance sensor 23 detects a change in the magnetic field level. Processor 22 compares the current magnetic field level reading against the previous charging cycle's maximum state of charge reading to determine the remaining charge in the battery, that is, its current SOC. When the battery is charged, the magnetic field level seen at the magnetoresistance sensor 23 again changes. Ideally, the reading should approach the MaxSOH reading of a new battery. However, as the battery ages, the ability to achieve this decreases. The processor 22 compares the current fully charged magnetic field level reading against the first, new battery MaxSOH reading to determine the overall health of the battery, that is, its current state SOH.

The BMS can also incorporate established techniques to determine the SOC and SOH of a battery. These techniques include open circuit voltage (OCV) measurements, voltage measurements during charge, discharge and relaxation conditions, charge and discharge current monitoring known as coulomb counting, and implementing predictive algorithms related to known characteristics of a battery type.

While particular elements, embodiments and applications of the present invention have been shown and described, it will be understood, that the invention is not limited thereto since modifications can be made by those skilled in the art without departing from the scope of the present disclosure, particularly in light of the foregoing teachings.

What is claimed is:

1. A battery management system comprising:
 (a) a bottom enclosure section;
 (b) a top enclosure section;
 (c) a source for generating a magnetic field;
 (d) a printed circuit board comprising:
  (i) a current sense resistor;
  (ii) a processor; and
  (iii) a sensor,
 wherein said bottom enclosure section comprises a first injection hole and a second injection hole wherein said first and second injection holes are configured to allow for an injected conductive infusion to flow through electrically connecting a battery management system wafer to a battery wafer.

2. The battery management system of claim 1, further comprising:
 (e) a conductive infusion.

3. The battery management system of claim 2, wherein said top enclosure section and said bottom enclosure section are configured to create a snap-fit assembly.

4. The battery management system of claim 3, wherein said snap-fit assembly is accomplished via at least one male barbed pin and at least one barbed pin hole configured to accept said male barbed pin.

5. The battery management system of claim 1, wherein said bottom enclosure section includes a rib, wherein said rib adds structural support.

6. The battery management system of claim 1, wherein said bottom enclosure section comprises at least one alignment pin configured to hold said printed circuit board in place.

7. The battery management system of claim 1, wherein said printed circuit board further comprises:
 (iv) a positive charging pole;
 (v) a positive load pole;
 (vi) a negative charging and load pole; and
 (vii) a conductive contact.

8. The battery management system of claim 1, wherein said top enclosure section comprises:
 (i) a void configured to receive said circuit board;
 (ii) at least one penetration configured for the insertion of a conductive contact, wherein said conductive contact provides an external connection to said battery management system;
 (iii) a first infusion zone;
 (iv) a second infusion zone; and
 (v) a third infusion zone.

9. The battery management system of claim 1, wherein said sensor is a magnetoresistance sensor.

10. The battery management system of claim 9, wherein said magnetoresistance sensor is configured to work with a battery and said source.

11. The battery management system of claim 10, wherein said source is a permanent magnet.

12. The battery management system of claim 11, wherein said permanent magnet is placed on a bottom interior surface of a battery wafer.

13. The battery management system of claim 11 wherein said permanent magnet is a Neodymium-Iron-Boron magnetic strip.

14. The battery management system of claim 1, wherein said sensor is configured to measure a battery's state of charge.

15. The battery management system of claim 1, wherein said sensor is configured to provide measurements used to determine a battery's state of health.

16. The battery management system of claim 1, further comprising at least one joining pin configured to hold said battery management system against a battery.

17. The battery management system of claim 16, wherein said battery is a battery wafer.

18. The battery management system of claim 16, wherein said battery comprises a plurality of battery wafers.

* * * * *